(12) United States Patent
Cheek et al.

(10) Patent No.: US 9,054,220 B2
(45) Date of Patent: Jun. 9, 2015

(54) EMBEDDED NVM IN A HKMG PROCESS

(71) Applicant: Freescale Semiconductor, Inc., Austin, TX (US)

(72) Inventors: Jon D. Cheek, Cedar Park, TX (US); Frank K. Baker, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 81 days.

(21) Appl. No.: 13/763,036

(22) Filed: Feb. 8, 2013

(65) Prior Publication Data

US 2014/0225176 A1    Aug. 14, 2014

(51) Int. Cl.
*H01L 21/8234* (2006.01)
*H01L 21/8238* (2006.01)
*H01L 27/115* (2006.01)

(52) U.S. Cl.
CPC .. *H01L 21/823842* (2013.01); *H01L 27/11546* (2013.01)

(58) Field of Classification Search
CPC ............. H01L 21/823842; H01L 29/66545; H01L 21/823857
USPC ......... 438/593, 258, 211, 267, 591, 488, 791, 438/201, 210; 257/324
See application file for complete search history.

(56) References Cited

U.S. PATENT DOCUMENTS

| | | | |
|---|---|---|---|
| 7,320,915 B2 | 1/2008 | Lee | |
| 7,524,719 B2 * | 4/2009 | Steimle et al. | 438/211 |
| 7,550,339 B2 | 6/2009 | Forbes | |
| 7,579,243 B2 * | 8/2009 | Kang et al. | 438/267 |
| 2010/0190354 A1 | 7/2010 | Nurnett et al. | |
| 2012/0104483 A1 * | 5/2012 | Shroff et al. | 257/324 |
| 2012/0322246 A1 * | 12/2012 | Wang et al. | 438/488 |
| 2013/0017678 A1 * | 1/2013 | Tsai et al. | 438/591 |

FOREIGN PATENT DOCUMENTS

| | | |
|---|---|---|
| KR | 1020020095547 A | 12/2002 |
| WO | 2006029061 A1 | 3/2006 |

OTHER PUBLICATIONS

Hall, Mark D. et al., U.S. Appl. No. 13/491,771, filed Jun. 8, 2012, entitled Integrating Formation of a Replacement Gate Transistor and a Non-Volatile Memory Cell Using a High-K Dielectric.
Shroff, Mehul et al., U.S. Appl. No. 13/491,760, filed Jun. 8, 2012, entitled Integrating Formation of a Replacement Gate Transistor and a Non-Volatile Memory Cell Using an Interlayer Dielectric.
Shroff, Mehul et al., U.S. Appl. No. 13/661,157, filed Oct. 26, 2012, entitled Method of Making a Logic Transistor and a Non-Volatile Memory (NVM) Cell.

(Continued)

*Primary Examiner* — Kenneth Parker
*Assistant Examiner* — Bo Fan
(74) *Attorney, Agent, or Firm* — Terrile, Cannatti, Chambers & Holland, LLP; Michael Rocco Cannatti

(57) ABSTRACT

A process integration is disclosed for fabricating complete, planar non-volatile memory (NVM) cells (110) prior to the formation of high-k metal gate electrodes for CMOS transistors (212, 213) using a planarized dielectric layer (26) and protective mask (28) to enable use of a gate-last HKMG CMOS process flow without interfering with the operation or reliability of the NVM cells.

10 Claims, 4 Drawing Sheets

(56) References Cited

OTHER PUBLICATIONS

Shroff, Mehul et al., U.S. Appl. No. 13/307,719, filed Nov. 30, 2011, entitled Logic and Non-Volatile Memory (NVM) Integration.
Shroff, Mehul et al., U.S. Appl. No. 13/343,331, filed Jan. 4, 2012, entitled Non-Volatile Memory (NVM) and Logic Integration.
Shroff, Mehul et al., U.S. Appl. No. 13/441,426, filed Apr. 6, 2012, entitled Non-Volatile Memory (NVM) and Logic Integration.
Hall Mark D. et al., U.S. Appl. No. 13/402,426, filed Feb. 22, 2012, entitled Non-Volatile Memory Cell and Logic Transistor Integration.
Hall, Mark D. et al., U.S. Appl. No. 13/442,142, filed Apr. 9, 2012, entitled Logic Transistor and Non-Volatile Memory Cell Integration.

* cited by examiner

EMBEDDED NVM IN A HKMG PROCESS

BACKGROUND OF THE INVENTION

1. Field of the Invention

The present invention is directed in general to integrated circuit devices and methods for manufacturing same. In one aspect, the present invention relates to the fabrication of CMOS metal gate devices and non-volatile memory devices integrated on a single substrate or chip.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications.

BRIEF DESCRIPTION OF THE DRAWINGS

The present invention may be understood, and its numerous objects, features and advantages obtained, when the following detailed description is considered in conjunction with the following drawings, in which.

Figure 1:
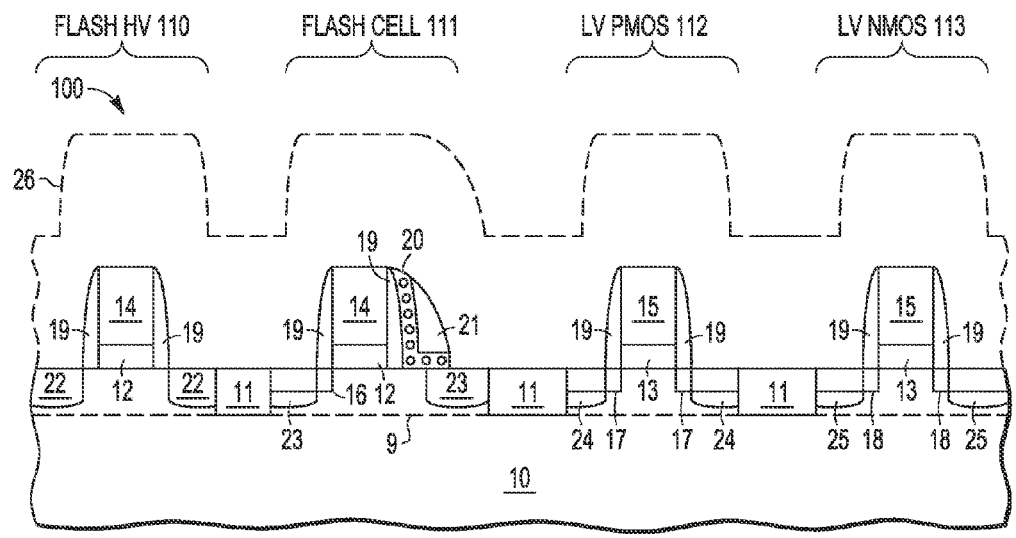
FIG. 1 is a partial cross-sectional view of a semiconductor structure in which high voltage transistors, non-volatile memory transistors, and CMOS transistors with sacrificial gate electrodes are formed with one or more poly gate layers in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A compact split-gate poly EEPROM bitcell integrated with high-k metal gate CMOS transistors and associated fabrication process are disclosed for providing CMOS logic with on-chip non-volatile memory storage using a CMOS gate-last fabrication sequence, thereby enabling the co-existence of embedded flash and CMOS-HKMG on the same wafer. The disclosed integration scheme uses one or more polysilicon gate layers to form substantially planar split-gate flash cells, high-voltage (HV) polysilicon transistors, and sacrificial poly gate electrodes (formed with low-k or high-k gate dielectric layers) on a substrate, and then forms a planarized dielectric layer over the substrate which is selectively masked with a protective film layer and etched to remove the sacrificial poly gate electrodes and form CMOS gate electrode openings in the planarized dielectric layer. With the protective film layer in place, high-k metal gate electrodes are formed in the CMOS gate electrode openings for the NMOS and PMOS devices. In selected embodiments, the high-k metal gate electrodes are formed by removing the sacrificial poly gate electrodes to leave or expose an underlying high-k gate dielectric layer that was previously formed, and then forming one or more metal gate layers on the exposed high-k gate dielectric layer. In other embodiments, the high-k metal gate electrodes are formed by removing the sacrificial poly gate electrodes and underlying (low-k) gate dielectric layer to expose the substrate, and then forming the high-k metal gate electrodes by depositing or forming high-k gate dielectric and metal gate layers. In any case, the protective film layer keeps metal materials from the flash cell and is removed during a final planarization step.

In this disclosure, an improved system, apparatus, and fabrication method are described for fabricating embedded non-volatile memory devices on-chip with CMOS metal-gate transistors using a gate-last process that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form high-k metal gate (HKMG) electrode stacks. With some existing HKMG fabrication processes, wafer planarization is required after all transistors are formed using a sacrificial polysilicon gate to implement an inlaid or damascene method of forming HKMG gates. However, non-volatile memory designs which use a double-high stack of poly-ONO (Oxide/Nitride/Oxide)-poly to form the charge storage elements (e.g., the floating gate of a MOSFET) would be destroyed during the planarization step required by the CMOS gate-last process. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a semiconductor structure 100 in which flash high voltage transistors 110, flash memory cells 111, and CMOS transistors 112-113 with sacrificial gate electrodes 13, 15 are formed with one or more poly gate layers in accordance with selected embodiments of the present invention. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted device structures 110-113 may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

In the semiconductor structure 100, the depicted device structures 110-113 are shown as being formed on or as part of a substrate 10 which may be formed as a bulk semiconductor substrate or other substrate in which one or more additional semiconductor layers and/or well regions are formed using epitaxial semiconductor growth and/or selective doping techniques as described more fully hereinbelow. For example, the substrate 10 may be a semiconductor-on-insulator (SOI) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 10 may be implemented as a bulk silicon substrate, single crystalline silicon (doped or undoped), SOI substrate, or any semiconductor material including, for example, Si, SiC, SiGe. SiGeC, Ge, GaAs, InAs. InP, as well as other III/V or II/VI compound semiconductors or any combination thereof. As indicated by the dashed line 9, an upper portion of the substrate 10 defines the active substrate layer which may be separately doped in different device regions.

In an upper region of the semiconductor structure 100, a plurality of shallow trench isolation (STI) structures 11 are formed that divide the substrate 10 into separate regions, such as a flash high voltage device region 110, a flash cell device region 111, a low voltage PMOS device region 112, and a low voltage NMOS region 113. Thus, the STI structures 11 define lateral boundaries of different regions 110-113, and may be formed using any desired technique, such as selectively etching an opening in the substrate 10 using a patterned mask or photoresist layer (not shown), depositing a dielectric layer (e.g., oxide) to fill the opening, and then polishing the deposited dielectric layer until planarized with the remaining substrate 10. Any remaining unetched portions of the patterned mask or photoresist layer(s) are stripped. As will be appreciated, the STI structures 11 may be formed in other ways in other embodiments. Although not shown, the active substrate layers between the STI regions 11 may be doped differently, depending on whether the transistors formed in each area are n-type or p-type devices. For example, the active substrate layers in the low voltage PMOS region 112 may be implanted with arsenic or phosphorus to form N-well regions (not shown), while the active substrate layers in the low voltage NMOS region 113 may be implanted with boron to form P-well regions (not shown).

In the semiconductor structure 100, different device structures 110-113 may be formed using one or more shared processing steps to form flash high voltage transistors 110, flash memory cells 111, and CMOS transistors 112-113 with one or more poly gate layers. By way of providing a non-limiting example of processing steps that may be used, one or more gate dielectric layers 12, 13 may be formed over the substrate 10 and STI structures 11, such as by growing or deposition a gate dielectric layer of silicon dioxide or other suitable gate dielectric material to a predetermined gate dielectric thickness. As will be appreciated, the gate dielectric layers 12, 13 may be formed with different materials, such as by using low-k dielectric materials to form the gate dielectric layers 12 in the flash regions 111, 111, and using high-k dielectric materials to form the gate dielectric layers 13 in the low voltage CMOS regions 112, 113. On the gate dielectric layer(s) 12, 13, one of more patterned conductor layers 14, 15 may be formed. In an example embodiment, the patterned conductor layers 14, 15 are formed by blanket-depositing a layer of polysilicon or SiGe over the gate dielectric layer(s) 12, 13 by CVD, PECVD, PVD, ALD, or any combination(s) thereof to a thickness of approximately 500-2000 Angstroms, though a thinner or thicker layer may also be used. The conductive gate stack layer(s) and underlying gate dielectric layers may be anisotropically etched to form the gate electrode stacks 12, 14 for the flash high voltage device 110 and flash cell devices 111, and to simultaneously form the sacrificial gate electrode stacks 13, 15 for the low voltage CMOS devices 112, 113. As will be appreciated, any desired gate patterning and etch sequence may be used to form the patterned gate electrode stacks, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning.

Once the patterned gate electrode stacks 12-15 are formed, one or more doped regions 16-18 may be formed in the substrate 10 by implanting impurities around the gate electrode stacks 12-15 and any implant masks using conventional implanting processes to implant ions having a predetermined conductivity type. For example, if the flash cell 111 is intended for P channel operation, the first doped region 16 is lightly implanted with boron, indium or another appropriate p-type dopant by selectively masking off the remainder of the substrate 10 from implantation. Conversely, if the flash cell 111 is intended for N channel operation, the first doped region 16 is lightly implanted with arsenic, phosphorous or another appropriate n-type dopant by selectively masking off the remainder of the substrate 10 from implantation. In similar fashion, lightly doped p-type regions 17 may be formed in the low voltage PMOS transistor 112 by implanting p-type dopants into the regions 17 using an implant mask, while lightly doped n-type regions 18 may be formed in the low voltage NMOS transistor 113 by implanting n-type dopants (e.g., arsenic, phosphorus or antimony) into the regions 18 using an implant mask. In addition, P+ and N+ source and drain regions may be formed in the substrate to further define the device structures 110-113.

At this juncture, one or more sidewall spacers 19 may be formed on the gate electrode stacks 12-15 as implant masks by forming and anisotropically etching a mask layer (e.g., silicon dioxide or nitride) on the patterned gate electrode stacks 12-15. In addition, processing steps may be used to fabricate the flash cell transistor 111 as a split-gate device (such as a thin film storage non-volatile memory cell) having a flash cell control gate 21 and sidewall Oxide/silicon-nanocluster/Oxide storage layer 20 formed over the select gate electrode 12, 14. As depicted, the sidewall storage layer 20 includes embedded nanoclusters which function to store charge in the dielectric layer. Beneath the sidewall storage layer 20, a control gate 21 may be formed by selectively forming an etched polysilicon control gate 21 (e.g., by anisotropically etching a deposited poly layer) which is separated from the select gate 14 by the sidewall storage layer 20 on the sidewall of the select gate 14. However, it will be appreciated that the split-gate device may be formed with different sequencing and/or materials.

Using the etched gate electrode stacks 12-15, 21 and sidewall spacers 19 in combination with one or more patterned implant masks (not shown), the flash high voltage transistors 110 and flash cell 111 may be implanted with n-type dopants to form the N+ source/drain regions 23, the low voltage PMOS transistors 112 may be implanted with p-type dopants to form the P+ source/drain regions 24, and the low voltage NMOS transistors 113 may be implanted with n-type dopants to form the N+ source/drain regions 25. To perform the implantation step, a mask is used to protect other parts of the semiconductor structure during implantation, and one or more sidewall spacers may also be used as implant masks by forming and anisotropically etching a mask layer (e.g., silicon dioxide or nitride) to form spacers on the sidewalls of the defined select and floating gates. Again, the selective implantation of source/drain regions may use existing CMOS processing technology processes, such as masking and implanting processes. In addition, the implanted regions 16-18, 22-25 are subsequently annealed or heated to drive or diffuse the implanted ions into the substrate 10 to a predetermined depth and lateral extent, though this can be done at a later stage in the fabrication process.

Figure 2:
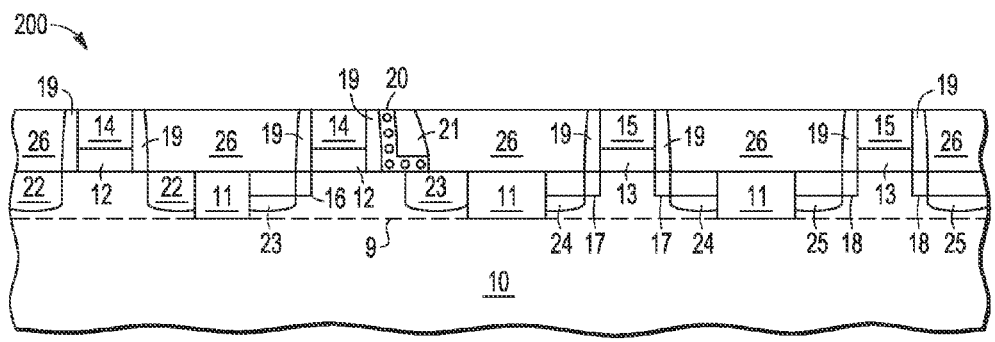
FIG. 2 illustrates processing subsequent to FIG. 1 after a planarized dielectric layer is formed over the high voltage transistors, non-volatile memory transistors, and CMOS transistors with sacrificial gate electrodes of the semiconductor wafer structure.

FIG. 2 illustrates processing of the semiconductor structure 200 subsequent to FIG. 1 after one or more planarized dielectric layers 26 are formed over the flash high voltage transistors 110, non-volatile memory transistors 111, and CMOS transistors 112-113. The planarized dielectric layer(s) 26 may form at least part of a first interlayer dielectric stack that electrically isolates the device components 110-113 formed on the substrate 10 from one another. Though not shown, an initial etch stop layer may be deposited over the semiconductor structure 200, such as by depositing silicon nitride to serve as a first mobile ion barrier layer. In addition or in the alternative, the planarized dielectric layers 26 may be formed with one or more dielectric pre-metal inter-level dielectric layers, including a deposited dielectric layer formed over the device components 110-113 to a thickness of approximately 500-5000 Angstroms, though other thicknesses may also be used. Any desired dielectric material may be used to form the dielectric layer, though in accordance with various embodiments, the dielectric layer is formed by depositing a conformal layer of silicon dioxide or other dielectric material using CVD, PECVD, PVD, ALD or any combination thereof. (In FIG. 1, the deposited conformal dielectric layer 26 is depicted with the dashed lines.) In addition, the deposited dielectric layer can be planarized to form the dielectric layer 26, alone or in combination with other dielectric layers, such as one or more gettering dielectric layers (e.g., a BPTEOS layer), sub-atmospheric tetra-ethyl orthosilicate (SATEOS) layer(s), low-pressure TEOS (LPTEOS) CVD layer(s), plasma-enhanced TEOS (PETEOS) layer(s), and/or $SiO_xN_y$, atmospheric pressure TEOS (APTEOS) layer(s), HDP BPTEOS or HDP plasma enhanced PTEOS layer(s). At this point, the deposited dielectric layer is planarized using any desired planarization process, such as a planarization process that uses a chemical mechanical polish step to form a substantially planar surface on the planarized dielectric layer 26. By using a timed CMP process, the planarized dielectric layers 26 exposes the patterned conductor layers 14, 15. The CMP process may partially remove a portion of device structures 110-113 as shown in FIG. 2, or it remove a minimal amount and leave these structures with substantially their original thickness. As will be appreciated, the planarized dielectric layers 26 may be densified with one or more anneal process steps, though it will be appreciated that an anneal process may also be applied subsequently in the fabrication process.

Figure 3:
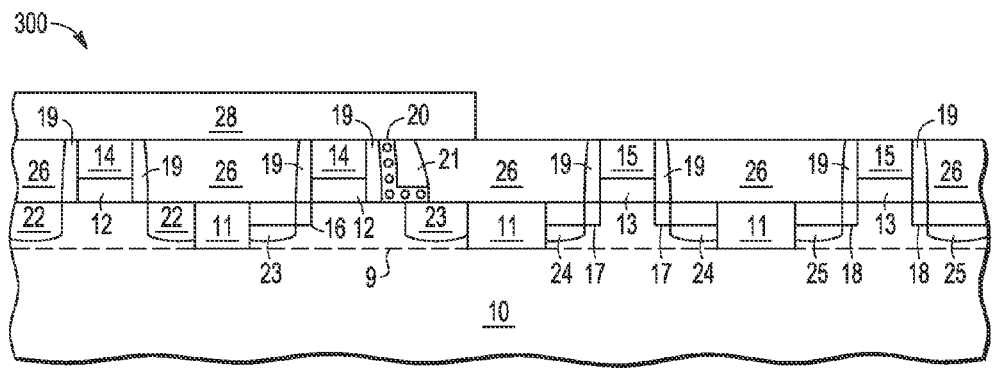
FIG. 3 illustrates processing subsequent to FIG. 2 after a patterned mask layer is selectively formed over the high voltage transistors and non-volatile memory transistors to expose the sacrificial gate electrodes from the CMOS transistors in the semiconductor wafer structure.

FIG. 3 illustrates processing of the semiconductor structure 300 subsequent to FIG. 2 after a patterned mask layer 28 is selectively formed over the flash high voltage transistors 110 and non-volatile memory transistors 111 to expose the sacrificial gate electrodes 13, 15 in the CMOS transistors 112-113. The patterned mask layer 28 may be formed as a patterned mask 28 by applying a layer of silicon nitride that is patterned to mask the gate electrode stacks 12, 14 for the flash high voltage device 110 and flash cell devices 111. However, a multi-layer masking technique may be used to form the patterned mask pattern 28 over the device areas 110, 111. In any event, the material used to form the patterned mask layer 28 is selected so as to be selective to the resist the subsequent poly and oxide etch processes, as well as high-k metal gate formation processes.

Figure 4:
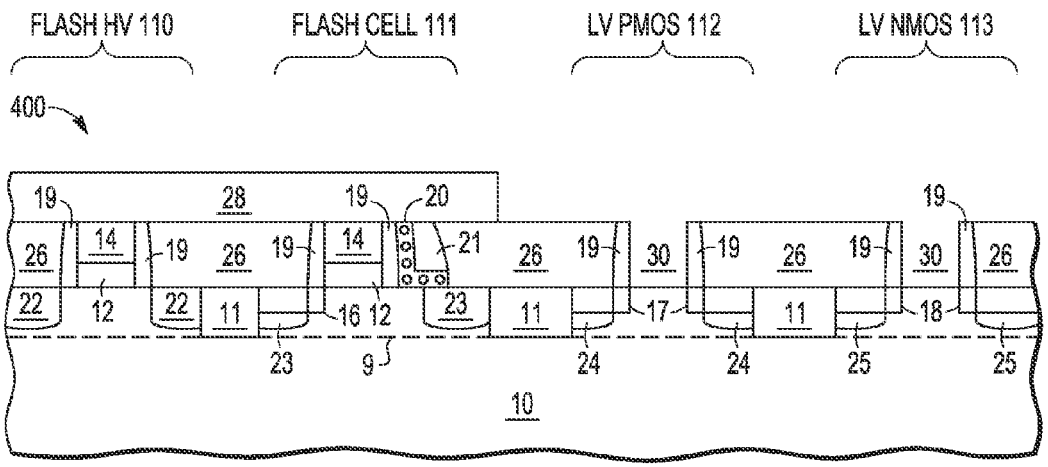
FIG. 4 illustrates processing subsequent to FIG. 3 after the sacrificial gate electrodes are removed from the semiconductor wafer structure to form CMOS gate electrode openings in the planarized dielectric layer.

FIG. 4 illustrates processing of the semiconductor structure 400 subsequent to FIG. 3 after the sacrificial gate electrodes 13, 15 are removed to form CMOS gate electrode openings 30 in the planarized dielectric layer 26. In particular, with the patterned mask layer 28 in place, one or more etch processes are applied to remove the constituent layers of the sacrificial gate electrodes 13, 15 in the CMOS transistors 112-113. For example, a first poly etch process is applied to remove the exposed portions of the patterned gate poly layers 15, where the poly etch process is selective to the material used to form the planarized dielectric layer 26 (e.g., oxide). The removal of the exposed portions of the patterned poly layers 15 may use any desired poly etch process, including a dry etching process such as reactive-ion etching, ion beam etching, plasma etching or laser etching, a wet etching process wherein a chemical etchant is employed or any combination thereof.

Once the exposed portions of the patterned poly layers 15 are removed, one or more dielectric etch processes are applied to remove the exposed portions of the patterned gate dielectric layers 13. Again, any desired oxide etch process may be used, including a dry etching process such as reactive-ion etching, ion beam etching, plasma etching or laser etching, a wet etching process wherein a chemical etchant is employed or any combination thereof. In selected embodiments, a wet etch chemistry is applied briefly to remove the gate dielectric layer(s) 13, where the timing of the wet etch is controlled to minimize any etching of the planarized dielectric layer(s) 26. At this juncture as the high-k metal gate formation processing begins, the patterned mask layer 28 may be left in place in order to protect the flash high voltage transistors 110 and flash memory cells 111 from the subsequent metal processing steps.

Though FIG. 4 shows that the gate dielectric layers 13 are removed along with the patterned poly layers 15, it will be appreciated that the gate dielectric layers 13 may be retained at this point. For example, if the gate dielectric layers 13 were previously formed as high-k gate dielectric layers, the selective removal of the patterned poly layers 15 leaves the high-k gate dielectric layer 13 exposed at the bottom of the electrode openings 30, thereby eliminating one or more of the gate dielectric formation steps described hereinbelow with reference to FIGS. 5-7.

Figure 5:
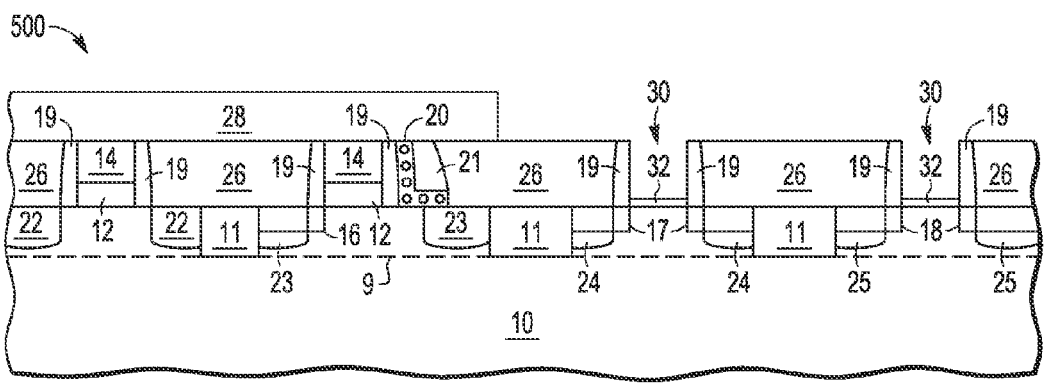
FIG. 5 illustrates processing subsequent to FIG. 4 after one or more buffer interface layers are formed on the bottom of the CMOS gate electrode openings of the semiconductor wafer structure.

FIG. 5 illustrates processing of the semiconductor structure 500 subsequent to FIG. 4 after one or more buffer interface layers 32 are formed on the bottom of the CMOS gate electrode openings 30. While the buffer interface layer(s) 32 may be formed with any desired technique, in selected embodiments, a buffer interface layer 32 is formed by thermally growing a layer of silicon dioxide to a predetermined thickness of approximately 8-9 Angstroms, though a thinner or thicker layer may also be used. By growing the oxide, the buffer interface layer 32 is formed on only the bottom of the exposed CMOS gate electrode openings 30.

Figure 6:
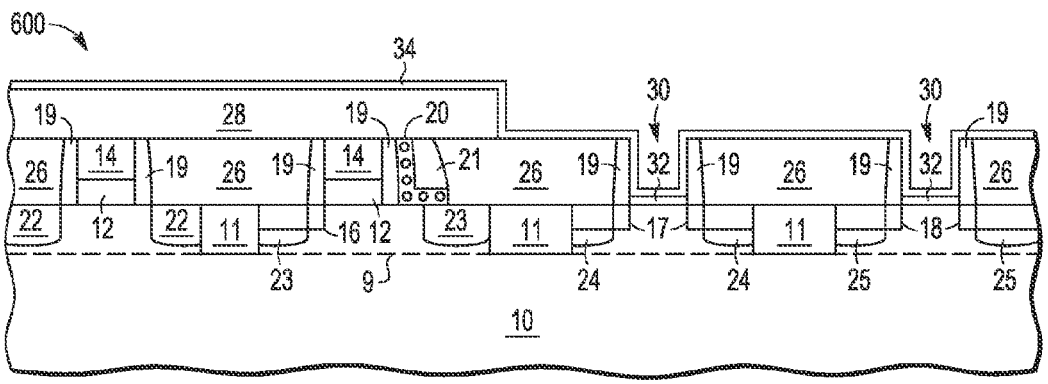
FIG. 6 illustrates processing subsequent to FIG. 5 after one or more high-k dielectric layers are formed over the semiconductor structure and in the CMOS gate electrode openings.

FIG. 6 illustrates processing of the semiconductor structure 600 subsequent to FIG. 5 after one or more high-k dielectric layers 34 are formed in the CMOS gate electrode openings 30 and on the buffer interface layer(s) 32. In selected embodiments, a first high-k gate dielectric layer 34 is formed by depositing a high-k gate dielectric material with a relatively high dielectric constant value on top of the semiconductor structure 600 using chemical vapor deposition (CVD), plasma-enhanced chemical vapor deposition (PECVD), physical vapor deposition (PVD), atomic layer deposition (ALD), or any combination(s) of the above. In selected embodiments, the first high-k gate dielectric layer 34 may be formed by a low temperature CVD or ALD process to a predetermined final thickness in the range of 1-100 Angstroms (e.g., 10-50 Angstroms, or more particularly, 20-30 Angstroms), though other thicknesses may be used. A suitable high-k gate dielectric material for the gate dielectric layer 34 is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_X$, $ZrSiO_X$, $LaSiO_X$, $YSiO_X$, $ScSiO_X$, $CeSiO_X$, and $HfLaSiO_X$. In addition, multi-metallic oxides (for example barium strontium titanate, BST) may also provide high-k dielectric properties. A suitable temperature for the deposition process is in the range of approximately 200 degrees Celsius to approximately 400 degrees Celsius. As will be appreciated, the first high-k gate dielectric layer 34 may be formed in other ways in other embodiments. And though not shown, the high-k dielectric layer 34 formed in the low voltage PMOS device region 112 may be formed with different materials or layers than used to form the high-k dielectric layer 34 in the low voltage NMOS device region 113. By using a deposition process, the high-k dielectric layer(s) 34 are formed on the bottom and sidewall surfaces of the CMOS gate electrode openings 30, and also over the planarized dielectric layer 26 and patterned mask layer 28.

Figure 7:
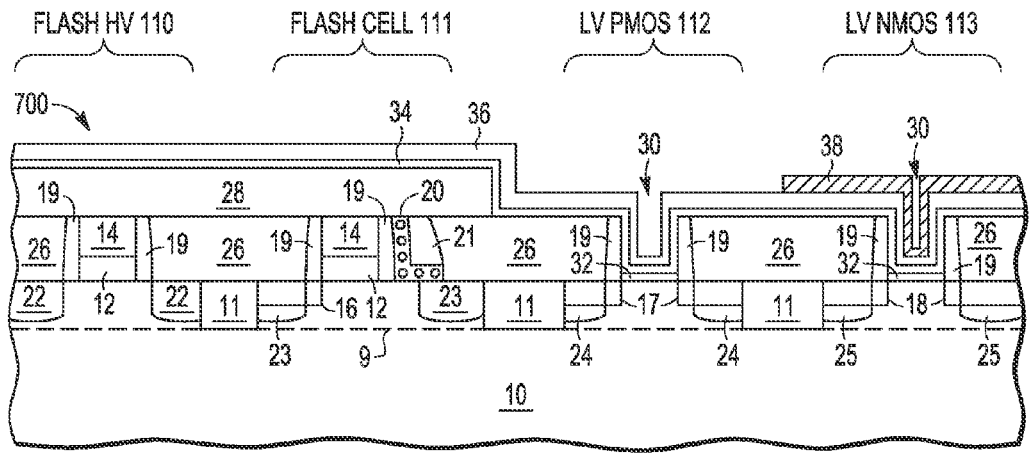
FIG. 7 illustrates processing subsequent to FIG. 6 after one or more metal interface layers are selectively formed over the semiconductor structure and in the CMOS gate electrode openings.

FIG. 7 illustrates processing of the semiconductor structure 700 subsequent to FIG. 6 after one or more metal interface layers 36, 38 are formed on the high-k dielectric layer(s) 34 in the CMOS gate electrode openings 30. In selected embodiments, a first metal interface layer 36 is selectively formed on the high-k gate dielectric layer 34 in at least the CMOS gate electrode opening 30 for the low voltage PMOS device region 112, while a second metal interface layer 38 is selectively formed on the high-k gate dielectric layer 34 in at least the CMOS gate electrode opening 30 for the low voltage NMOS device region 113. This sequence can be implemented by depositing the first metal interface layer 36 on the high-k dielectric layer(s) 34 in all exposed CMOS gate electrode openings 30 and over the planarized dielectric layer 26 and patterned mask layer 28, followed by deposition of a second metal interface layer 38 in the CMOS gate electrode openings 30 of the low voltage NMOS device area 113 and selective etching using a patterned mask (not shown) to expose and remove the second metal interface layer 38 from the low voltage PMOS device area 112 so that, when the patterned mask is removed, the first metal interface layer 36 and second patterned metal interface layer 38 are formed. In selected embodiments, the first metal interface layer 36 covers both the PMOS device 112 and the NMOS device 113, while the second metal interface layer 38 covers only the NMOS device 113. Of course, additional metal interface layers can be used, or alternatively, a single metal interface layer may be formed over both the low voltage PMOS and NMOS regions 112-113. In any case, the metal interface layers 36, 38 may be deposited using any desired deposition or sputtering process, such as CVD, PECVD, PVD, ALD, molecular beam deposition (MBD) or any combination(s) thereof. A suitable material for use as the metal interface layers 36, 38 is an element or alloy (e.g., TaC or W) which may be deposited to a predetermined thickness of 20-150 Angstroms (e.g., 50-100 Angstroms), though other metallic layer materials with different thicknesses may be used. In selected embodiments, the metal interface layers 36, 38 may include an element selected from the group consisting of Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as $IrO_2$).

Figure 8:
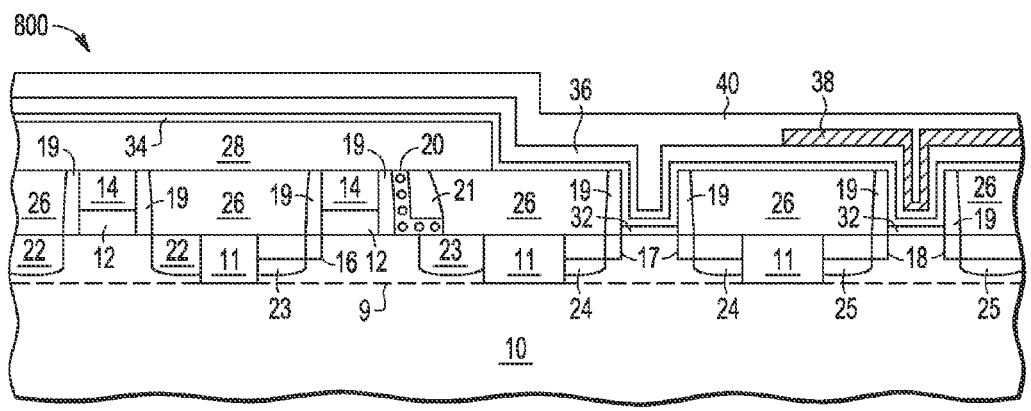
FIG. 8 illustrates processing subsequent to FIG. 7 after one or more metal gate layers are formed over the semiconductor structure and in the CMOS gate electrode openings.

FIG. 8 illustrates processing of the semiconductor structure 800 subsequent to FIG. 7 after one or more metal gate layers 40 are formed on the metal interface layer(s) 36, 38 in the CMOS gate electrode openings 30. In selected embodiments, the metal gate layer 40 is formed with a conductive material, such as a gate barrier layer formed with a metal or transition metal material including, as an example, titanium or TiN, that is formed using CVD, PECVD, PVD, ALD, MBD, or any combination(s) thereof to a predetermined thickness in the range of 200-1000 Angstroms (e.g. 500-600 Angstroms), though other materials and thicknesses may be used. In other embodiments, the metal gate layer 40 is a doped silicon-containing gate layer 40 disposed over the metal interface layer(s) 36, 38 to form a metal gate stack. In selected embodiments, the silicon-containing layer 40 is an amorphous or polysilicon cap layer or an amorphous/poly silicon germanium cap layer that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. Silicon-containing gate layer 40 may also be a doped or undoped amorphous silicon or silicon germanium layer. An anti-reflective coating (ARC) (not shown) may subsequently be formed over silicon-containing gate layer 40 to a thickness in the range of approximately 10 to 200 Angstroms, though other thicknesses may be used. In a selected embodiment, ARC layer is formed by depositing a silicon-rich silicon nitride layer, an organic ARC, a silicon-oxy nitride, or any ARC material which serves an ARC function for the particular lithography process. As will be appreciated, ARC layer may be applied directly to the silicon-containing gate layer 40 or as part of a multilayer mask on the silicon-containing gate layer 40. As deposited, the amorphous silicon-containing gate layer 40 covers the low voltage NMOS and PMOS device area 112-113.

Figure 9:
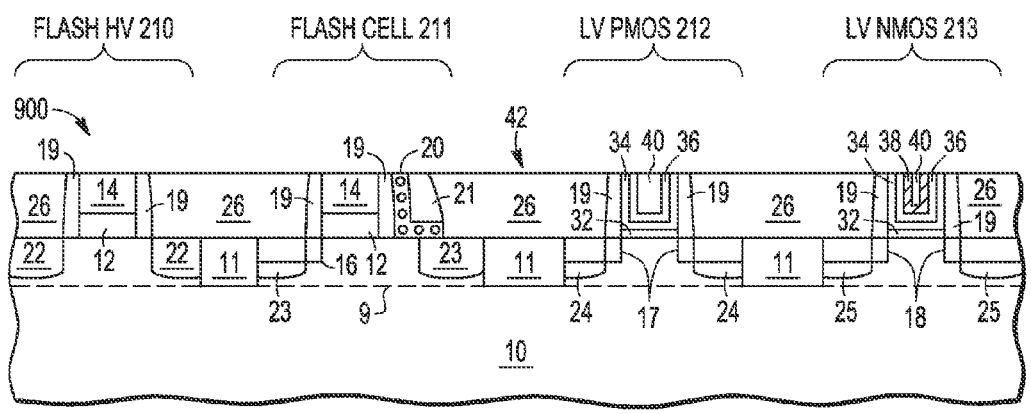
FIG. 9 illustrates processing subsequent to FIG. 8 after one or more polish and/or etch steps are applied to remove the patterned mask layer and form planarized high voltage transistors, non-volatile memory transistors, and CMOS transistors.

FIG. 9 illustrates processing of the semiconductor structure 900 subsequent to FIG. 8 after one or more planarization steps are applied to complete an inlaid or damascene fabrication sequence for forming the HKMG electrodes by removing the patterned mask layer 28 and forming planarized flash high voltage transistors 210, flash memory cells 211, and low voltage CMOS transistors with high-k metal gate electrodes 212-213. While any desired planarization process may be used, in accordance with various embodiments, the semiconductor structure 900 may be planarized with one or more polish and/or etch processes, such as using a chemical mechanical polish step to form a substantially planar surface 42 by removing the patterned mask layer 28 and planarizing the upper portions of the planarized dielectric layer 26 and gate electrode structures 14, 19-21, 34, 36, 40. In addition, a separate masked etch process could be used to remove the patterned mask layer 28 before planarizing the remaining semiconductor structure 900. By leaving the patterned mask layer 28 in place until the final CMP processing, the poly gate electrode layers in the flash high voltage transistors 210 and flash memory cells 211 are protected from the metal materials used to form the high-k metal gate electrodes of the low voltage CMOS transistors 212-213. Mask layer 28 may be removed either by the CMP process, or with a subsequent selective etch process.

As will be appreciated, additional processing steps may be used to complete the fabrication of the devices 210-2113. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 10:
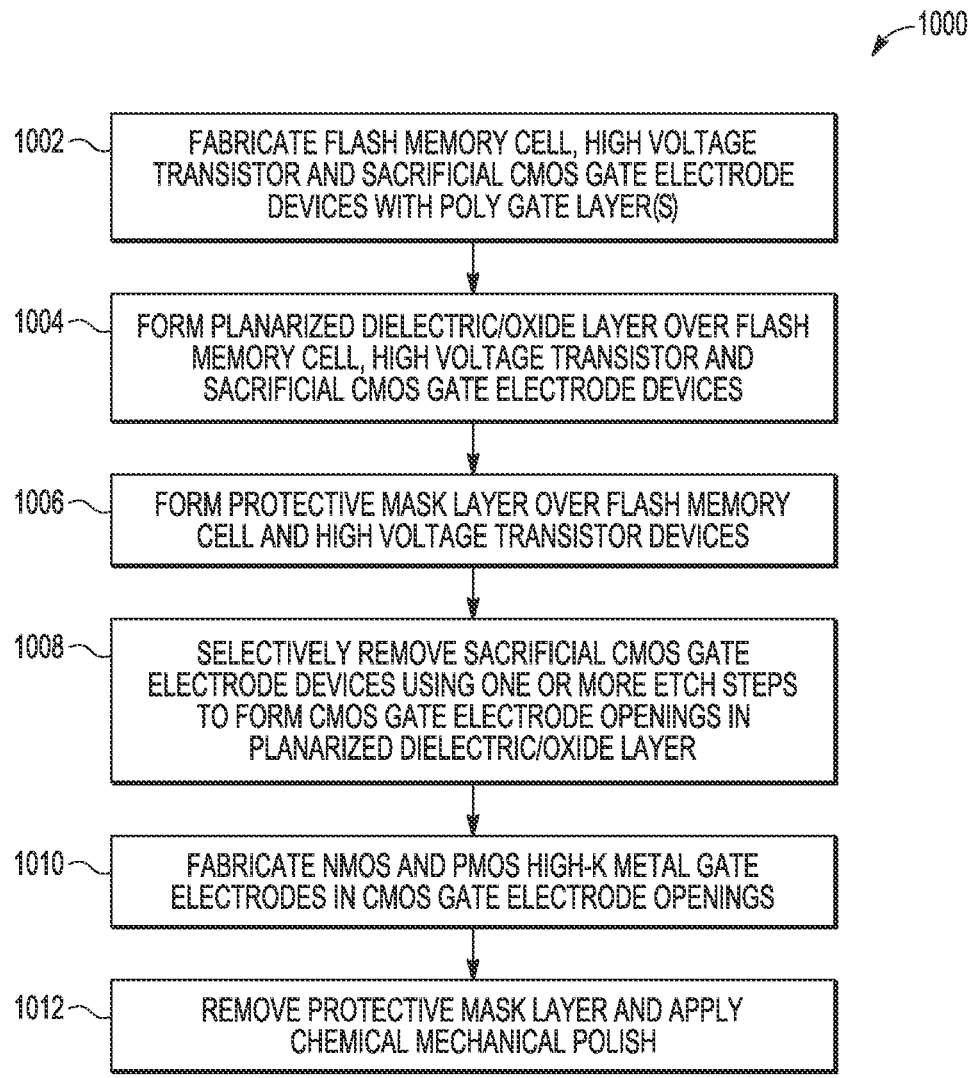
FIG. 10 illustrates a simplified process flow for fabricating embedded split-gate flash memory devices with one or more poly gate layers in a gate-last process for forming CMOS high-k metal gate electrode transistor devices.

FIG. 10 is a flow diagram illustrating an example process 1000 for forming embedded split gate flash memory devices having polysilicon storage nodes on the same wafer with high-k metal gate electrode transistor devices using a gate-last CMOS fabrication process. As shown, the process begins at step 1002 during the front end of line (FEOL) process for forming planar split-gate flash memory cells and high voltage transistor devices with one or more poly gate electrode layers. During the FEOL process, sacrificial CMOS gate electrode devices are formed using the same gate dielectric (e.g., silicon dioxide) and gate electrode (e.g., polysilicon) layers that are used to fabricate the gate electrodes for the planar split-gate flash memory cells and high voltage transistor devices. At this stage, the source and drain regions have already been formed in the underlying substrate in appropriate alignment with the sacrificial CMOS gate electrodes. Next, a planarized dielectric layer is formed over the planar split-gate flash memory cells, high voltage transistors, and sacrificial CMOS gate electrode devices at step 1004. For example, the planarized dielectric layer may be formed by depositing a conformal layer or film of silicon oxide which is then polished to a flat or planarized surface which exposes at least the upper portions of the sacrificial CMOS gate electrode devices. At step 1006, a protective mask layer is formed over the planar split-gate flash memory cells and high voltage transistor devices, leaving exposed the sacrificial CMOS gate electrode devices. For example, the protective mask may be formed by depositing a protective film of silicon nitride over the wafer which is then patterned and etched to expose the low voltage CMOS area while covering the planar split-gate flash memory cells and high voltage transistor devices. At step 1008, the sacrificial CMOS gate electrode devices are selectively removed using one or more etch steps to form CMOS gate electrode openings in the planarized dielectric layer. For example, one or more poly etch steps may be applied to remove the upper poly layer in the sacrificial CMOS gate electrode devices, followed by one or more oxide etch steps which remove the gate dielectric layer from the sacrificial CMOS gate electrode devices. At step 1010. NMOS and PMOS high-k metal gate electrodes are formed in the CMOS gate electrode openings in the planarized dielectric layer. While different materials and processes may be used to form the constituent gate electrode layers for the NMOS and PMOS gate electrodes, respectively, the selected materials will include at least a first high-k gate dielectric layer and one or more metal-based gate electrode layers which may be individually chosen for the NMOS and PMOS transistor devices. At step 1012, the protective mask layer is removed and the wafer is planarized (e.g., with a CMP process).

By now it should be appreciated that there is provided herein a semiconductor fabrication process for embedding non-volatile memory devices in an HKMG CMOS process. In the disclosed process, a wafer is provided that has a plurality of planar nonvolatile memory cell gate structures (e.g., split-gate flash memory cell gate structures) formed over a substrate with one or more polysilicon layers, and a plurality of sacrificial transistor gate structures formed over the substrate with the one or more polysilicon layers. For example, the wafer may be a semiconductor-on-insulator (SOI) substrate structure in which source drain regions are formed in functional alignment with the plurality of planar split-gate flash memory cell gate structures and the plurality of sacrificial transistor gate structures. In selected embodiments, the wafer includes the plurality of planar nonvolatile memory cell gate structures and a plurality of flash high voltage transistor gate structures formed over the substrate with one or more polysilicon layers, and a plurality of CMOS sacrificial transistor gate structures formed over the substrate with one or more polysilicon layers. A dielectric layer is formed over the wafer having a substantially flat upper surface which exposes an upper surface of the plurality of sacrificial transistor gate structures. In selected embodiments, the dielectric layer is formed by depositing a conformal oxide layer over the wafer to cover the plurality of planar nonvolatile memory cell gate structures and the plurality of sacrificial transistor gate structures, and planarizing the conformal oxide layer with a chemical mechanical polish process to form the substantially flat upper surface. After forming the dielectric layer, a protective mask layer is formed over the plurality of planar nonvolatile memory cell gate structures. The protective mask layer may be formed by depositing a silicon nitride layer over the wafer to cover the dielectric layer, and selectively etching the silicon nitride layer to expose the plurality of sacrificial transistor gate structures. With the protective mask layer in place, the plurality of sacrificial transistor gate structures are selectively removed from the dielectric layer without removing the plurality of planar nonvolatile memory cell gate structures, thereby forming a plurality of gate electrode openings in the dielectric layer. In selected embodiments, the sacrificial transistor gate structures are selectively removed by applying one or more poly etch processes to remove the one or more polysilicon layers from the plurality of sacrificial transistor gate structures, and then applying one or more dielectric etch processes to remove one or more gate dielectric layers from the plurality of sacrificial transistor gate structures, thereby exposing the substrate with the plurality of gate electrode openings in the dielectric layer. Thereafter, high-k metal gate electrodes are formed in the plurality of gate electrode openings. In selected embodiments, the high-k metal gate electrodes are formed by growing a thermal oxide interface layer on exposed substrate surfaces of the plurality of gate electrode openings, then forming one or more high-k dielectric layers in the plurality of gate electrode openings in the dielectric layer using a dielectric material (e.g., metal oxide, hafnium oxide, etc.) which has a dielectric constant value of 7.0 or greater, and then depositing one or more metal gate electrode layers over the one or more high-k dielectric layers in the plurality of gate electrode openings in the dielectric layer. In other embodiments, the high-k metal gate electrodes are formed by forming a metal layer in the plurality of gate electrode openings which may expose the substrate or a previously formed high-k gate dielectric layer, and then polishing the metal layer down to be substantially coplanar with the plurality of nonvolatile memory cell gate structures to define a plurality of high-k metal gate electrodes in the plurality of gate electrode openings. In still other embodiments, the plurality of sacrificial transistor gate structures are selectively removed by applying one or more poly etch processes to remove the one or more polysilicon layers to expose an underlying high-k gate dielectric layer in the plurality of gate electrode openings in the dielectric layer; and the metal layer is formed by depositing one or more metal gate electrode layers over the underlying high-k gate dielectric layer in the plurality of gate electrode openings.

In another form, there is provided a method of making a semiconductor device having an embedded non-volatile memory cell and HKMG transistor. In the disclosed methodology, a non-volatile memory cell is formed having a first patterned polysilicon gate electrode stack and aligned source/drain regions formed in a substrate. For example, the non-volatile memory cell may be a split-gate flash memory cell having a patterned polysilicon control and select gate structure with aligned source/drain regions formed in the substrate. In other examples, the non-volatile memory cell may be formed as a split-gate memory cell with a charge storage layer containing nanoclusters. In other examples, the non-volatile memory cell may be a memory cell formed with a charge storage layer containing silicon nitride. In other examples, the non-volatile memory cell may be a memory cell formed with a nitride storage layer and a patterned polysilicon control gate structure with aligned sourceidrain regions formed in the substrate. In addition, a MOSFET transistor is formed having a sacrificial polysilicon gate electrode stack and aligned source/drain regions formed in the substrate. For example, the MOSFET transistor may be formed as one of a plurality of CMOS transistors, each comprising a sacrificial polysilicon gate electrode stack and aligned source/drain regions formed in the substrate. Subsequently, a planarized first dielectric layer is formed over the semiconductor device to cover the non-volatile memory cell and MOSFET transistor except for a top portion of the first patterned polysilicon gate electrode stack and sacrificial polysilicon gate electrode stack. In selected embodiments, the planarized first dielectric layer is formed by depositing a conformal oxide layer to cover the non-volatile memory cell and the MOSFET transistor, and planarizing the conformal oxide layer with a chemical mechanical polish process to form the planarized first dielectric layer. Subsequently, a patterned protective layer is selectively formed to cover the first patterned polysilicon gate electrode stack and to expose the sacrificial polysilicon gate electrode stack. In selected embodiments, the patterned protective layer may be formed by depositing a silicon nitride layer to cover the planarized first dielectric layer, and selectively etching the silicon nitride layer to expose the sacrificial polysilicon gate electrode stack of the MOSFET transistor. With the patterned protective layer in place, the sacrificial polysilicon gate electrode stack is removed to form a gate electrode opening in the planarized first dielectric layer while protecting the first patterned polysilicon gate electrode stack with the patterned protective layer. The sacrificial polysilicon gate electrode stack may be removed by applying one or more poly etch processes to remove one or more polysilicon layers from the sacrificial polysilicon gate electrode stack, and then applying one or more dielectric etch processes to remove one or more gate dielectric layers from the sacrificial polysilicon gate electrode stack, thereby exposing the substrate with gate electrode opening in the planarized first dielectric layer. Subsequently, a metal-gate electrode stack is formed in the gate electrode opening while protecting the first patterned polysilicon gate electrode stack with the patterned protective layer. In selected embodiments, the metal-gate electrode stack may be formed by forming one or more high-k dielectric layers in the gate electrode opening using a metal oxide layer (such as a hafnium-based dielectric material) and depositing one or more metal gate electrode layers over the one or more high-k dielectric layers to fill the gate electrode opening. Thereafter, the patterned protective layer may be removed by applying one or more chemical mechanical polish and/or etch steps to planarized the semiconductor device and form a high-k metal-gate electrode stack that is substantially coplanar with the first patterned polysilicon gate electrode stack is planarized with a chemical mechanical polish process.

In yet another form, there is provided an integrated semiconductor structure with embedded flash devices. The disclosed integrated semiconductor structure includes a plurality of substantially planar split-gate flash memory cell gate structures located over a first substrate region. Each planar split-gate flash memory cell gate structure includes a gate dielectric layer, and one or more etched polysilicon layers formed on the gate dielectric layer. The disclosed integrated semiconductor structure also includes a plurality of damascene high-k metal-gate electrode structures formed over a second substrate region. In selected embodiments, each damascene high-k metal-gate electrode structure includes a conformally deposited high-k gate dielectric layer located on bottom and sidewall surfaces of a gate electrode opening formed in a dielectric layer, and one or more deposited metal layers formed on the conformally deposited high-k gate dielectric layer. In other embodiments, each damascene high-k metal-gate electrode structure includes a high-k gate dielectric layer and one or more deposited metal layers formed on the high-k gate dielectric layer. As formed, the plurality of planar split-gate flash memory cell gate structures and the plurality of damascene high-k metal-gate electrode structures are substantially coplanar with one another.

Although selected embodiments use a split-gate NVM cell with a storage layer containing silicon nanoclusters, any desired NVM cell structures may also be used which are substantially coplanar with the gates of high voltage transistors and sacrificial gates of the low voltage CMOS transistors. Examples of alternative NVM cells include a split-gate cell utilizing a nitride storage layer, and a one-transistor NVM cell utilizing nitride storage (also known as a SONOS NVM cell).

Although the described exemplary embodiments disclosed herein are directed to various semiconductor device structures and methods for making same using an integrated poly/HKMG process, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various poly gate electrode devices are illustrated as being split-gate flash memory devices, this is merely for convenience of explanation and not intended to be limiting and persons of skill in the art will understand that the principles taught herein apply to devices of either conductivity type. Accordingly, other types of poly gate devices may be formed on-chip with metal-gate electrodes as disclosed herein. Moreover, the thicknesses and doping concentrations of the described layers may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising." or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
   providing a wafer comprising;
      a plurality of nonvolatile memory cell gate structures formed over a substrate with one or more polysilicon layers, and
      a plurality of sacrificial transistor gate structures formed over the substrate with the one or more polysilicon layers;
   forming a dielectric layer having a substantially flat upper surface which exposes an upper surface of the plurality of sacrificial transistor gate structures;
   forming a protective mask layer over the plurality of nonvolatile memory cell gate structures;
   selectively removing the plurality of sacrificial transistor gate structures using the protective mask layer to protect the plurality of nonvolatile memory cell gate structures to form a plurality of gate electrode openings in the dielectric layer without removing the plurality of nonvolatile memory cell gate structures;
   forming a metal layer in the plurality of gate electrode openings; and
   polishing the metal layer down to be substantially coplanar with the plurality of nonvolatile memory cell gate structures to define a plurality of high-k metal gate electrodes in the plurality of gate electrode openings.

2. The semiconductor fabrication process of claim 1, where providing the wafer comprises providing forming source/drain regions in the substrate which are in functional alignment with the plurality of nonvolatile memory cell gate structures and the plurality of sacrificial transistor gate structures.

3. The semiconductor fabrication process of claim 1, where providing the wafer comprises:
   forming the plurality of nonvolatile memory cell gate structures and a plurality of high voltage transistor gate structures over the substrate with one or more polysilicon layers; and
   forming a plurality of CMOS sacrificial transistor gate structures over the substrate with one or more polysilicon layers.

4. The semiconductor fabrication process of claim 1, where forming the dielectric layer comprises:
   depositing a conformal oxide layer over the wafer to cover the plurality of nonvolatile memory cell gate structures and the plurality of sacrificial transistor gate structures, and
   planarizing the conformal oxide layer with a chemical mechanical polish process to form the substantially flat upper surface.

5. The semiconductor fabrication process of claim 1, where forming the protective mask layer comprises:
   depositing a silicon nitride layer over the wafer to cover the dielectric layer; and
   selectively etching the silicon nitride layer to expose the plurality of sacrificial transistor gate structures.

6. The semiconductor fabrication process of claim 1, where selectively removing the plurality of sacrificial transistor gate structures comprises:
   applying one or more poly etch processes to remove the one or more polysilicon layers from the plurality of sacrificial transistor gate structures; and
   applying one or more dielectric etch processes to remove one or more gate dielectric layers from the plurality of sacrificial transistor gate structures, thereby exposing the substrate with the plurality of gate electrode openings in the dielectric layer.

7. The semiconductor fabrication process of claim 1, where forming high-k metal gate electrodes comprises:
   forming one or more high-k dielectric layers in the plurality of gate electrode openings in the dielectric layer using a dielectric material which has a dielectric constant value of 7.0 or greater; and
   depositing one or more metal gate electrode layers over the one or more high-k dielectric layers in the plurality of gate electrode openings in the dielectric layer.

8. The semiconductor fabrication process of claim 7, further comprising growing a thermal oxide interface layer on exposed substrate surfaces of the plurality of gate electrode openings before forming the one or more high-k dielectric layers in the plurality of gate electrode openings.

9. The semiconductor fabrication process of claim 1, where selectively removing the plurality of sacrificial transistor gate structures comprises applying one or more poly etch processes to remove the one or more polysilicon layers to expose an underlying high-k gate dielectric layer in the plurality of gate electrode openings in the dielectric layer; and where forming the metal layer comprises depositing one or more metal gate electrode layers over the underlying high-k gate dielectric layer in the plurality of gate electrode openings.

10. The semiconductor fabrication process of claim 1, where the plurality of nonvolatile memory cell gate structures comprises a plurality of split-gate flash memory cell gate structures.

* * * * *

UNITED STATES PATENT AND TRADEMARK OFFICE
CERTIFICATE OF CORRECTION

PATENT NO. : 9,054,220 B2
APPLICATION NO. : 13/763036
DATED : June 9, 2015
INVENTOR(S) : Jon D. Cheek and Frank K. Baker, Jr.

It is certified that error appears in the above-identified patent and that said Letters Patent is hereby corrected as shown below:

In the claims

Column 14, line 15, Claim 7, should read: "providing a wafer comprising:"

Signed and Sealed this
Twentieth Day of October, 2015

Michelle K. Lee
*Director of the United States Patent and Trademark Office*